United States Patent [19]
Rafati et al.

[11] Patent Number: 5,986,501
[45] Date of Patent: Nov. 16, 1999

[54] LOW VOLTAGE, BETA IMMUNE VARIABLE GAIN AMPLIFIER WITH HIGH SUPPLY VOLTAGE REJECTION

[75] Inventors: Hamid Rafati, Cupertino; Rudolphe Gustave Eschauzier, Santa Clara, both of Calif.

[73] Assignee: Philips Electronics North America Corporation, New York, N.Y.

[21] Appl. No.: 09/107,529

[22] Filed: Jun. 30, 1998

[51] Int. Cl.$^6$ ................................ H03F 3/45; G06F 7/44
[52] U.S. Cl. ......................... 330/254; 330/261; 3217/359
[58] Field of Search ................................ 330/254, 252, 330/261; 327/359

[56] References Cited

U.S. PATENT DOCUMENTS

| | | | |
|---|---|---|---|
| 3,968,453 | 7/1976 | Hongu et al. | 330/29 |
| 5,185,581 | 2/1993 | Brown | 330/254 |
| 5,325,070 | 6/1994 | McGinn | 330/256 |
| 5,475,339 | 12/1995 | Maida | 330/252 |
| 5,483,194 | 1/1996 | Genest | 327/359 |

*Primary Examiner*—Benny Lee
*Assistant Examiner*—Patricia T. Nguyen
*Attorney, Agent, or Firm*—Brian J. Wieghaus

[57] ABSTRACT

A variable gain amplifier includes a Gilbert cell multiplier cell having a pair of bipolar input transistors and a pair of bipolar output transistors. A bias circuit provides a first bias current to the input transistors and a second bias current to the output transistors, the ratio of the second to the first bias current determining the gain of the multiplier cell. The bias circuit couples the first and second bias currents to the emitters of the input and output transistors and references these currents to ground, which provides excellent supply rejection. Additionally, high beta immunity is achieved by increasing the ratio of the second bias current to the first bias current by subtracting a current from the first bias current substantially equal to the base currents of the output transistors.

12 Claims, 4 Drawing Sheets

LOW VOLTAGE, BETA IMMUNE VARIABLE GAIN AMPLIFIER WITH HIGH SUPPLY VOLTAGE REJECTION

BACKGROUND OF THE INVENTION

1. Field of the Invention

The invention relates generally to gain control circuits of the type having a transconductance multiplier circuit biased by a bias circuit. More particularly, the invention concerns a variable gain amplifier ("VGA") with high beta immunity and supply voltage rejection suited for low voltage applications.

2. Description of the Prior Art

Gain control circuits are generally known and have widespread used in the electronic arts. With the increasing popularity of mobile and hand held computing and/or communicating devices, such as cell phones, laptop computers, and personal digital assistants, there is an increased need for gain control circuits which can withstand the supply voltage variations which commonly occur in battery operated devices. Additionally, in order to reduce power consumption, it is desirable for such gain control circuits to operate with low supply voltages, such as on the order of 3.5–5 volts.

Of particular usefulness are gain control circuits which allow the gain to be varied continuously. FIG. 1 shows a known circuit in the form of a bipolar Variable Gain Amplifier (VGA), which employs a Gilbert cell multiplier circuit 100. This circuit is known from the text: B. Gilbert, Analog IC Design, The Current-Mode Approach, Chapter 2 (United Kingdom 1990). The Gilbert multiplier circuit 100 (FIG. 1(a)) includes a pair of differentially coupled input transistors Q1A, Q1B and a pair of differentially coupled output transistors Q2A, Q2B. The collectors of the transistors are coupled to a supply 10. A differential input signal current is supplied to the bases of the two input transistors via the two input terminals 2 and 3. Each of the input transistors has a common base/collector and thereby function as diodes to convert the input current into a voltage at their respective bases/collectors. This voltage is then reconverted into a current at the output terminals 4 and 5 by the output transistors Q2A and Q2B. The emitters of the input transistors Q1A, Q1B are biased by a first bias current 2*I1 while the emitters of the output transistors Q2A, Q2B are biased by a second bias current 2*I2, both supplied by the bias circuit of FIG. 1(b).

The bias circuit of FIG. 1(b) includes a first current mirror consisting of the current mirror transistors Q3, Q4. The collector of the transistor Q3 serves as the input of the first current mirror 110, and is fed by a current source 101. The output of the current mirror 110 is coupled to the collector of the transistor Q4, and is related to the current provided by the current source 101, by a factor N, the current mirror ratio. Similarly, the second bias current is output by a second current mirror 120 consisting of the current mirror transistors Q5, Q6 fed by a second current source 102.

For this Gilbert cell, it is known from the above-mentioned text that the current gain between the common base/collector terminals of the input transistors Q1A, Q1B (the differential input current) and the collectors of the output transistors Q2A, Q2B (the differential output current), equals the ratio of the collector bias currents of the input and output transistors. Assuming infinite β's, this leads to the following current gain $A_i$ between the input and output terminals $$A_i = \frac{i_{out}}{i_{in}} = \frac{I_{c2}}{I_{c1}} = \frac{I_{e2}}{I_{e1}} \quad (1)$$

where $i_{out}$ and $i_{in}$, are the differential output and input currents, $I_{c2}$ is the sum of the collector currents of the transistors Q2A, Q2B, and $I_{c1}$ is the sum of the collector currents of the input transistors Q1A, Q1B. Similarly $I_{e2}$ and $I_{e1}$ are the sum of the emitter currents of the output and input transistors, respectively. Note that the right hand equality also holds for non-infinite β's. β is defined as the common collector/base current amplification factor of a bipolar transistor.

The relative simplicity of the Gilbert cell in FIG. 1 and its predictable control characteristic have made the circuit a popular choice in bipolar intermediate frequency (IF) VGA circuits.

An important disadvantage surfaces, however, with real transistors that have non-infinite β's. Especially at high gain settings, the base currents of the output transistors Q2A, Q2B can result in a deviation from the gain predicted by Eq. 1. This is due to the fact that the base currents of the output transistors Q2A and Q2B are taken from the-input signal, which effectively lowers the actual signal current available at the collectors of the input transistors Q1A and Q1B. The total small-signal base current that is drained away from the input at each side of the circuit equals the sum of the base currents of the input transistors ("ib1") and the sum of the base output transistors ("ib2"). To first order, the sum of the base currents of the input transistors Q1A and Q1B is $i_{in}/\beta$, while the sum for the output transistor Q2A and Q2B is $A_i i_{in}/\beta$. Therefore, the total signal current directed away from the collectors of Q1A and Q1B is $i_{in}(1+A_i)/\beta$, and the total gain $A_{i,\beta}$ becomes $$A_{i,\beta} = A_i \left(1 - \frac{1+A_i}{\beta}\right) \quad (2)$$

By defining the desired gain setting $A_{i,d}$ $$A_{i,d} = \frac{I_2}{I_1}, \quad (3)$$

we can approximate Eq. 2 by $$A_{i,\beta} \approx A_i \left(1 - \frac{1+A_{i,d}}{\beta}\right) \quad (4)$$

Assuming a current gain β of 50 and a gain setting $A_i = A_{i,d}$ of 10, the resulting gain $A_{i,\beta}$ becomes 7.8, which amounts to a gain error of 22% between the actual gain and the desired gain setting $A_{i,d}$.

It is an object of the invention to provide a gain control circuit with less error between the actual gain of the circuit and the ideal gain, as indicated by the ratio of the bias current of the output and input transistors.

It is another object of the invention to provide such a circuit while maintaining high supply voltage rejection.

It is yet another object of the invention to provide such a circuit suitable for low voltage operation.

SUMMARY OF THE INVENTION

Generally speaking, the above objects are accomplished in a gain control circuit according to the invention having a current multiplier circuit which includes a first, differentially coupled input pair of bipolar transistors each having a common base/collector junction and a second, differentially coupled output pair of bipolar transistors, each of the output transistors having a base coupled to the base of a respective one of the input transistors. A bias circuit biases the emitters of the input transistors with a first bias current and the emitters of the output transistors with a second bias current to control the gain of the multiplier cell equal to a selected gain setting $A_{i,d}$, i.e. a desired ratio between the differential output current and the differential input current. The ratio of (i) the second bias current and (ii) the first bias current minus a current substantially equal to the base currents of the output transistors is substantially equal to the selected gain setting $A_{i,d}$.

The invention is based on the recognition that the error in the gain factor of the multiplier circuit, due to the reduction in base currents of the input transistors caused by their common connection with the bases of the output transistors, can be substantially corrected by reducing the emitter bias current applied to the input transistors by an amount equal to the base current of the output transistors. Favorably, the bias circuit generates the first and second bias currents along equal paths so that the circuit has a high supply voltage rejection.

In an embodiment, the bias circuit generates first and second currents, subtracts from the first current a third current substantially equal to the base currents of the output pair of transistors, and biases the emitters of the input transistors with a first bias current equal to the first current minus the third current and the emitters of the output transistors with the second bias current equal to the second current.

In one embodiment, the bias circuit includes a first, input current mirror, fed by a first current source, and which outputs the first current. A second current source feeds a second current mirror, having an output coupled to the emitters of the output pair of transistors. The second current mirror includes a pair of bipolar current mirror transistors having bases coupled to each other, which bases have a base current reflecting the base currents of the output pair of transistors of the multiplier cell. The output of the second current mirror outputs the second current, which is also the second bias current. A third current mirror has an input coupled to the bases of the current mirror transistors of the second current mirror, and an output coupled to the output of the first current mirror. The third current mirror subtracts from the first current output by the first current mirror a current substantially equal to the base currents of the second pair of current mirror transistors. In this way, via the current mirrors, the base currents of the output pair of transistors are subtracted from the input pair of transistors. Additionally, since the bias currents of the input and output stage follow identical paths, they are both affected in the same way by changes in the supply voltage. Therefor, the gain control circuit exhibits high supply voltage rejection.

According to another embodiment, the transistors of the first and second current mirrors are bipolar transistors. The bias circuit further includes first and second beta helper transistors each having emitters coupled to bases of the bipolar transistors of the first and second current mirrors. The beta helper transistors reduce the error inherent in bipolar current mirrors due to base currents.

According to still another embodiment, the voltage headroom of the bias circuit is improved by substituting common-emmitter devices for the beta helper transistors.

The invention also relates to a method of generating bias currents for such a multiplier cell.

These and other object, features and advantages of the invention will become apparent with reference to the following detailed description and the drawings.

DETAILED DESCRIPTION OF THE PREFERRED EMBODIMENTS

Figure 1A:
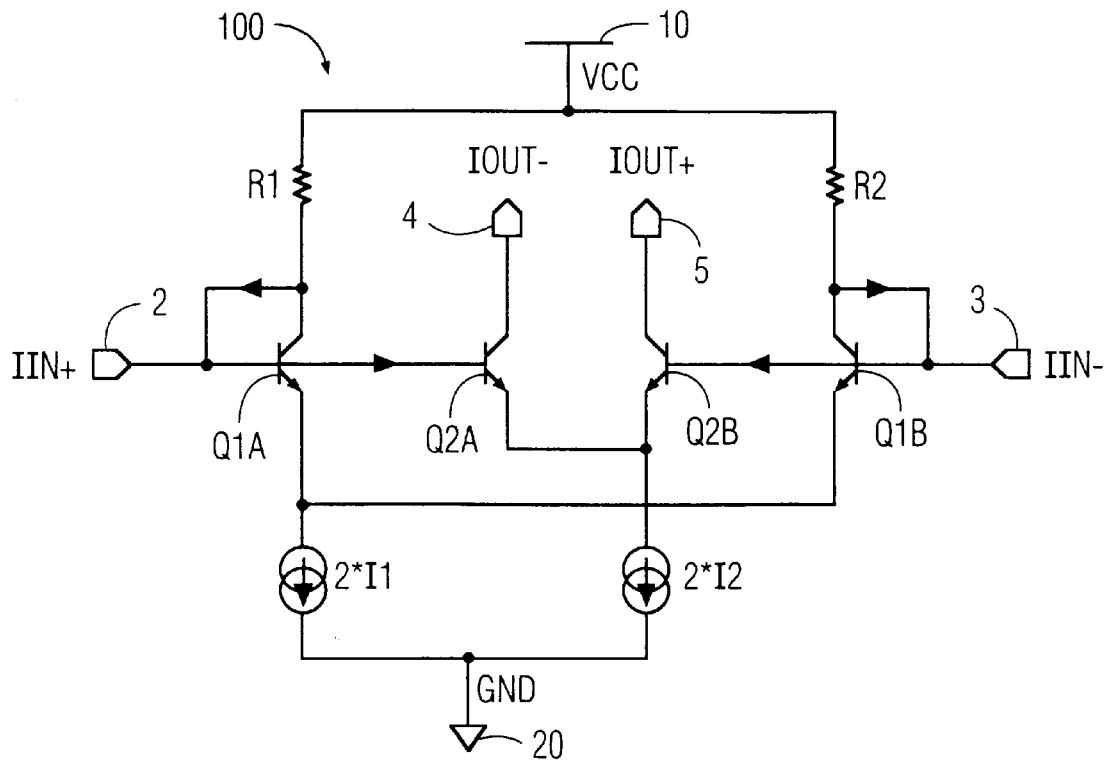
FIGS. 1(a) and FIG. 1(b) illustrate a known variable gain amplifier with a Gilbert cell multiplier and biasing circuit.
Figure 1B:
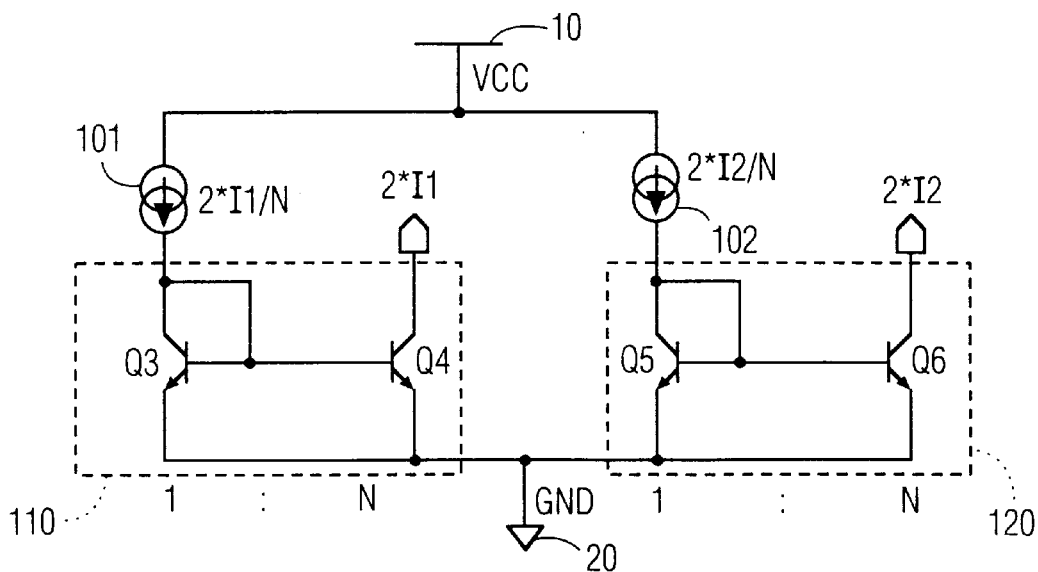
Figure 2A:
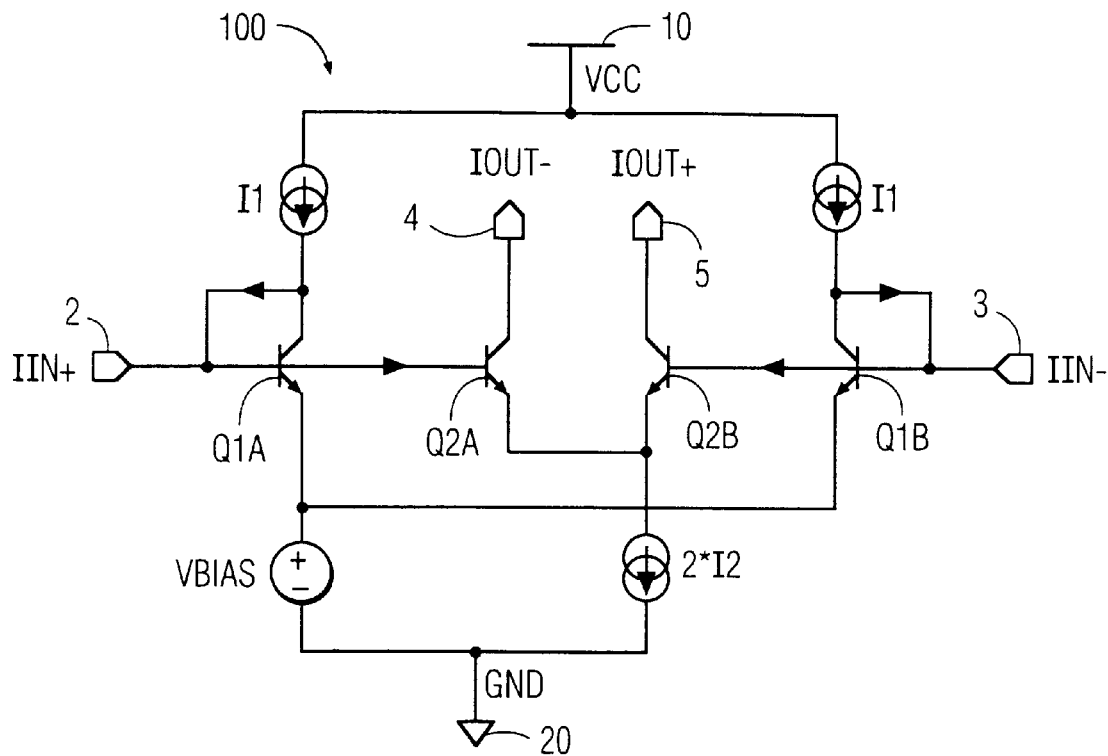
FIGS. 2(a); 2(b) illustrate another prior art variable gain amplifier.

FIGS. 2(a), (b) show another known gain control circuit with a Gilbert multiplier in which the gain loss, due to the input signal that disappears into the bases of the output transistors, is counteracted by increasing the ratio between the output and input bias currents. This ratio is set by the bias circuit (FIG. 2b) to be higher than the desired gain setting $A_{i,d}$ of the multiplier circuit. Circuit elements corresponding to those of FIG. 1 bear the same reference numerals. In contrast to the circuit of FIG. 1(a), the bias currents to the input transistors Q1A, Q1B are supplied to the collectors rather than the emitters of the transistors Q1A, Q1B.

In FIG. 2a, the collector bias current $I_{c1}$ of either input transistor Q1A or Q1B equals $$I_{c1} = I_1 - I_{b1} - I_{b2} = I_1 - I_{b1}\left(1 + \frac{I_{b2}}{I_{b1}}\right) \approx I_1\left(1 - \frac{1 + A_{i,d}}{\beta}\right) \quad (5)$$

where $I_{b1}$ and $I_{b2}$ represent the base current of the respective input/and output transistors Q1A, Q2A or Q2A, Q2B. Furthermore, the collector bias current $I_{c2}$ of an output transistor Q2 approximately equals its emitter current and hence half the current generated by the tail current source:

$$I_{c2} \approx I_2 \quad (6)$$

Combining the current gain equation (1) with Eq. 5 and Eq. 6 we obtain $$\frac{I_{c2}}{I_{c1}} = A_i \approx \left(1 - \frac{1}{\frac{1 + A_{i,d}}{\beta}}\right) = A_{i,d}\left(1 - \frac{1}{\frac{1 + A_{i,d}}{\beta}}\right) \quad (7)$$

What Eq. 7 shows, is that the ratio of the collector bias currents between the output and input transistors is slightly higher than the desired gain setting $A_{i,d}$. This is due to the base currents of the output transistors Q2A and Q2B that are robbed from the collectors of the input transistors Q1A and Q1B. Since the collector currents of the input transistors are in the denominator of the gain expression Eq. 1, this will help increase the gain. If it were for the effect of the base currents on the biasing alone, the ideal current gain Ai would be too high by the factor between brackets on the right hand side of Eq. 7. Looking at Eq. 4, however, we find that the small-signal effect of the beta on the current gain was for it to become too low by the same factor. Substituting Eq. 7 into Eq. 4, we find $$A_{i,\beta} \approx A_{i,d} \qquad (8)$$

So for the circuit of FIG. 2, the total current gain $A_{i,\beta}$ approximately equals the desired current gain $A_{i,d}$. The error in the approximation of Eq. 8 is about $1/\beta$, which is an order of magnitude better than the error predicted by Eq. 4.

In the circuit of FIG. 2, the bias current I1 to each of the input transistors Q1A, Q1B are supplied to the collectors of these transistors while the bias currents to the output transistors are supplied to the emitters of the transistors Q2A, Q2B. The output transistor bias current "2*I2" is supplied by a current source 102 and current mirror 120. The input bias currents are supplied by a current source 103, which feeds current mirror 110. However, the output of current mirror 110 feeds another current mirror 125 consisting of the transistors Q7, Q8 and Q9. The collectors of the transistors Q8 and Q9 are coupled to the collectors of the input transistors Q1A, Q1B. This means that the bias current for the input transistors passes through one more current mirror than the bias current for the output transistors. Due to the resistances of these current mirrors, the ratio of the bias currents are supply voltage dependent. Thus, changes in the supply voltage will causes unwanted changes in the gain of the circuit.

The supply voltage sensitivity of the circuit of FIG. 2 could be reduced by increasing the output impedance of the current mirrors, for example, by resistive degeneration or by using cascodes. In many applications, this is not a feasible alternative as both techniques require increased headroom, which is difficult to obtain in circuits with low supply voltages, such as in portable communicating devices such as cell phones and personal digital assistants.

Figure 3A:
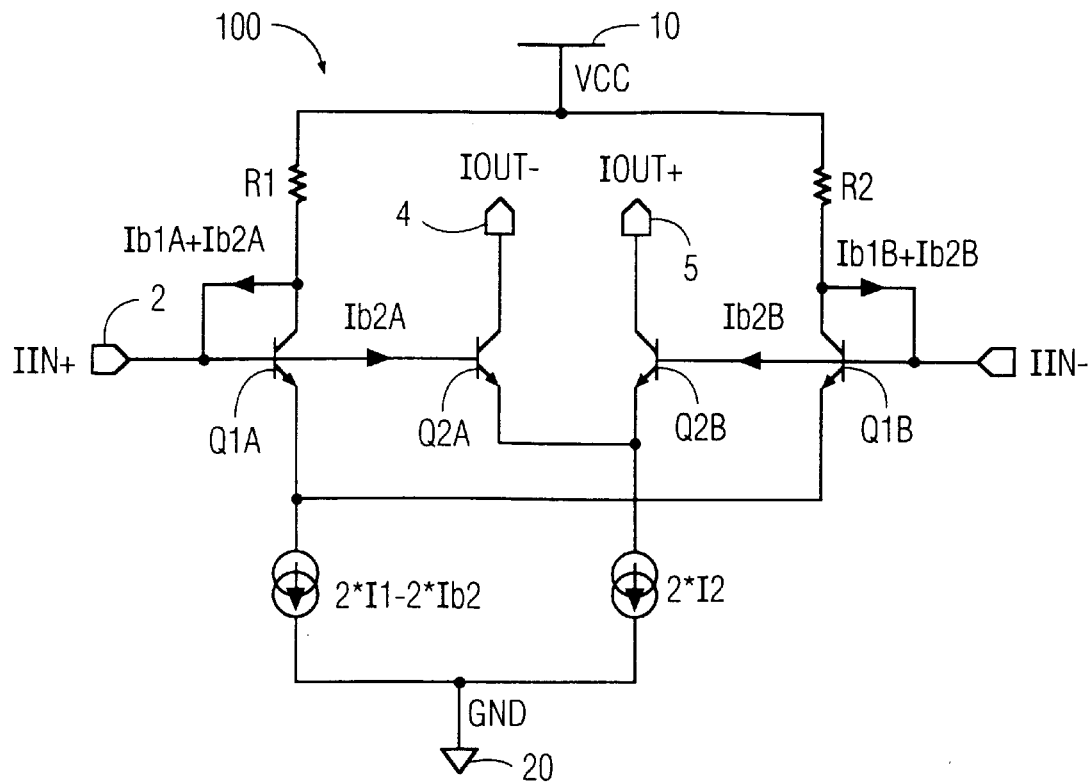
FIGS. 3(a), 3(b) illustrate a variable gain amplifier according to the invention.

With this additional background in mind, FIGS. 3(a), (b) show a variable gain amplifier according to the invention including a Gilbert multiplier cell 100 and a biasing circuit 200. The basic operation of the multiplier cell 100 was already explained with reference to FIG. 1(a), so it will not be further described herein except in connection with the improved operation with the bias circuit 200. The variable gain amplifier of FIG. 3 provides excell ent supply rejection by generating the bias currents along substantially equal paths and applying the bias currents to the emitters of input and output transistors. However, the amplifier of FIG. 3 overcomes the poor beta immunity of the prior art circuit of FIG. 1 by increasing the ratio of the bias current of the output and input transistors, thus compensating for the small-signal gain loss due to the finite beta's of the transistors of the multiplier cell 100.

Figure 3B:
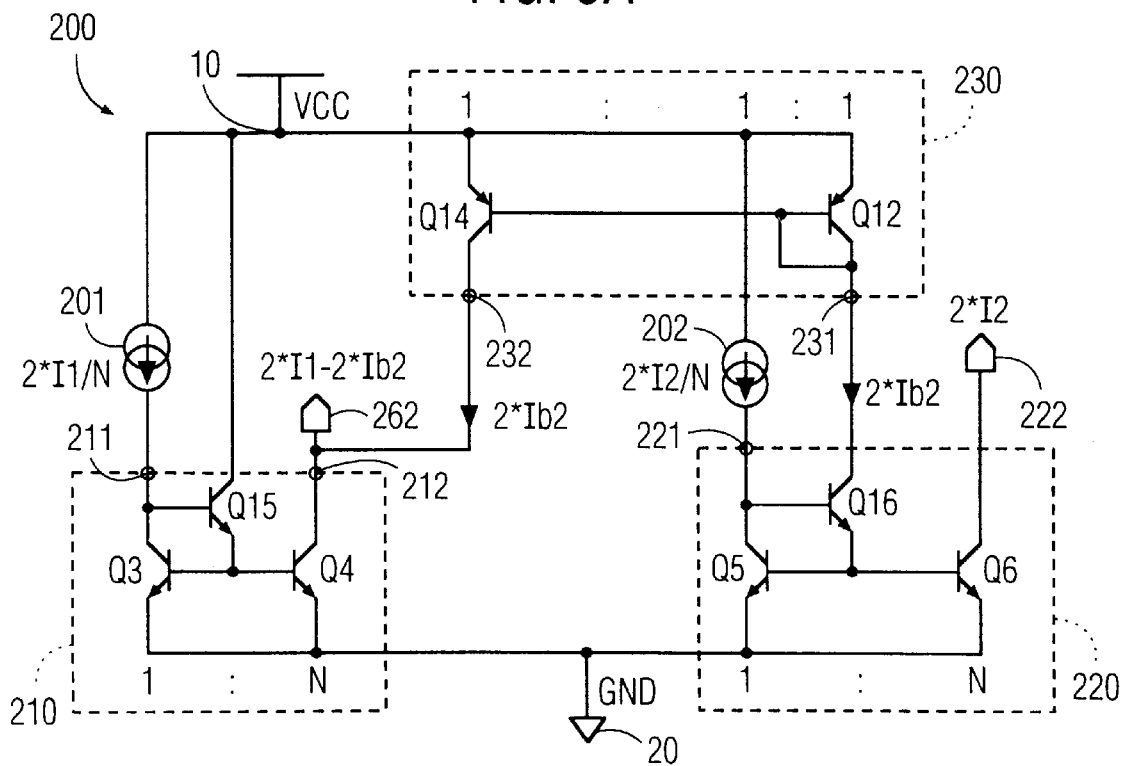

The bias circuit in FIG. 3(b) includes first and second current sources 201, 202, and first, second and third current mirrors 210, 220 and 230. The first, input current mirror 210 has an input 211 coupled to the first current source 201, and an output 212 which supplies a first current. The first current (2*I1) is a multiple N of the current supplied by the current source 201 (2*I1/N), dependent on the current mirror ratio of the mirror 210. The first current mirror includes the bipolar transistors Q3 and Q4 having their emitters coupled to the supply 20. The collector of the transistor Q3 is connected to input 211 while the collector of the transistor Q4 is connected to the output 212 of the current mirror 210, which is also the first output of the bias circuit 200. The bases of the transistors Q3 and Q4 are coupled to each other.

The second current mirror 220 has an input 221 coupled to the second current source 202 and an output 222 which provides a second current (2*I2), related to the current supplied by source 202 (2*I2/N) by the current mirror ratio N of the second current mirror. The output 222 is coupled to each emitter of the output pair of transistors Q2A, Q2B of multiplier 100 to provide a second bias current to each of these output transistors. The second current mirror includes bipolar current mirror transistors Q5, Q6 also having their emitters coupled to the second supply 20. The collector of the transistor Q5 is connected to the input 221 of the current mirror 220 while the collector of the transistor Q6 is connected to the output 222 of this current mirror.

The third current mirror 230 is an NPN current mirror having an input 202 coupled to a junction between the bases of the transistors Q5 and Q6 and an output 232 coupled to the output terminal 262. The current mirror 230 includes bipolar NPN transistors Q12, Q14 having their emitters coupled to the first supply 10. The bases of transistors Q12 and Q14 are coupled to each other and to the collector of transistor Q12. The collector of the transistor Q14 is coupled to the output 232 while the collector of the transistor Q12 is coupled to a junction between the bases of the current mirror transistors Q5, Q6 of the second current mirror.

The third current mirror 230 subtracts from the first current (supplied by the output 212 of the first current mirror) a current substantially equal to the base currents of the second pair of current mirror transistors Q5, Q6. Depending on the degree of $\beta$ matching of the transistors Q5, Q6 with the transistors of the multiplier cell, the base currents of the transistors Q5, Q6 reflect the base currents of the transistors Q2A, Q2B. In this way, the small-signal loss (2*Ib2) from the bases of the input transistors, caused by the base currents of the output transistors, is subtracted from the first current (2*I1). Thus, when the second and first current sources 202, 201 are set to provide a ratio of the second to the first current of a desired gain setting, the actual bias current ratio is higher, as the denominator is smaller by a quantity equal to the base currents of the output transistors. This subtraction will increase the current gain and counteract the small-signal loss effect of finite $\beta$'s in the transistors of the multiplier cell 100. The better the match between the $\beta$'s of the transistors Q5, Q6 of the second current mirror and those of the bipolar transistors Q1A, Q1B; Q2A, Q2B of the multiplier cell, the closer the actual gain will be to the desired gain.

In a conventional bipolar current mirror arrangement, the transistors Q3, Q5 of the first and second current mirrors would have their bases coupled directly to the collector to provide a common base/collector, like the transistor Q12. Circuit 200, however, has beta helper transistors Q15, Q16. Beta helper transistor Q15 has its collector coupled to the first supply 10, its emitter coupled to a junction between the bases of transistors Q3, Q4 and its base coupled to the current source 201 and collector of the transistor Q3. The collector of beta helper transistor Q16 is coupled to the input 231 of current mirror 230, while its emitter is coupled to the bases of the transistors Q5 and Q6 of the current mirror 220, and its base is coupled to current source 221 and the collector of the transistor Q5. The beta helper transistors Q15, Q16 improve the accuracy of the current mirrors 210, 220 by reducing the effect of base currents. Without the transistor Q15, the base current of the transistors Q3 and Q4 would be supplied directly by the current source 201. With the is transistor Q15, the current provided by source 201 is reduced by a factor $\beta$ of the transistor Q15. This is an improvement because the collector current of the transistor Q3 is closer to the current 2*I1/N supplied by the source 201.

Furthermore, the PNP current mirror 230 realizes a high beta immunity. For a large current mirror ratio N for the second current mirror 220, the base current for the output transistor Q6 of this current mirror will be provided by the beta helper transistor Q16. Since the collector current of the transistor Q6 equals 2*I2, the base current provided by the transistor Q16 equals 2*Ib2, where Ib2 is the base current of each of the multiplier output transistors Q2A and Q2B. This again assumes identical betas for the transistors in the second current mirror of the biasing circuit and the multiplier cell 100. The base current that is provided by the beta helper transistor Q16 is mirrored through the PNP current mirror 230 and subtracted from the first current (2*I1), providing the first bias current supplied to the to the input pair Q1A, Q1B via the output 262. The resulting bias emitter current of each of the multiplier input transistors Q1A and Q1B is $$I_{cI} \approx I_{eI} = I_1 - I_{b2} = I_1 - \frac{I_{c2}}{\beta} = I_1 - \frac{I_1 A_{i,d}}{\beta} = I_1\left(1 - \frac{A_{i,d}}{\beta}\right) \quad (9)$$

For any desired gain this expression is sufficiently close to Eq. 5 to achieve the same level of beta immunity as the prior art circuit of FIG. 2. For lower gain $A_{i,d}$, the compensation described by Eq. 9 does not quite track that of Eq. 5. Fortunately, at low gains the effect of the beta on the gain accuracy becomes small (see Eq. 4), and beta compensation is not as much of an issue anymore.

Figure 2B:
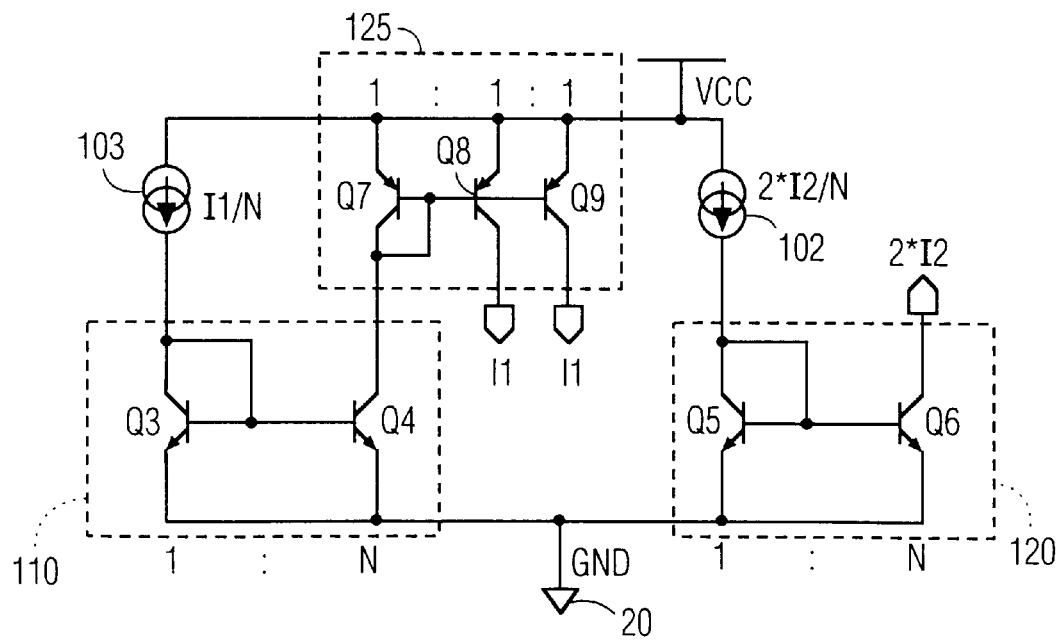

In practice, the circuit of FIG. 3 according to the invention achieves the same level of beta immunity as the prior art circuit of FIG. 2, but the circuit according to the invention is highly insensitive to supply voltage fluctuations. Note that in the prior art circuit of FIG. 2, the supply voltage sensitivity was caused by the bias current for the input transistors being generated through the use of two serially coupled current mirrors 110, 125, while the bias current for the output transistors was generated using only one current mirror 120. In contrast, the input and output bias currents in the circuit of FIG. 3(b) are generated through the use of equal paths, namely one current mirror 210, 220 for each respective path. Note that the third current mirror merely reflects the base currents (2*Ib2), which are very small compared to the bias currents 2*I1 and 2*I2, so there is negligible error due to supply voltage variation. Supply voltage rejection is also improved in the circuit according to the invention in that both bias currents are referenced to ground, whereas in the circuit of FIG. 2(b), the bias current for the input transistors is referenced to Vcc.

Figure 4:
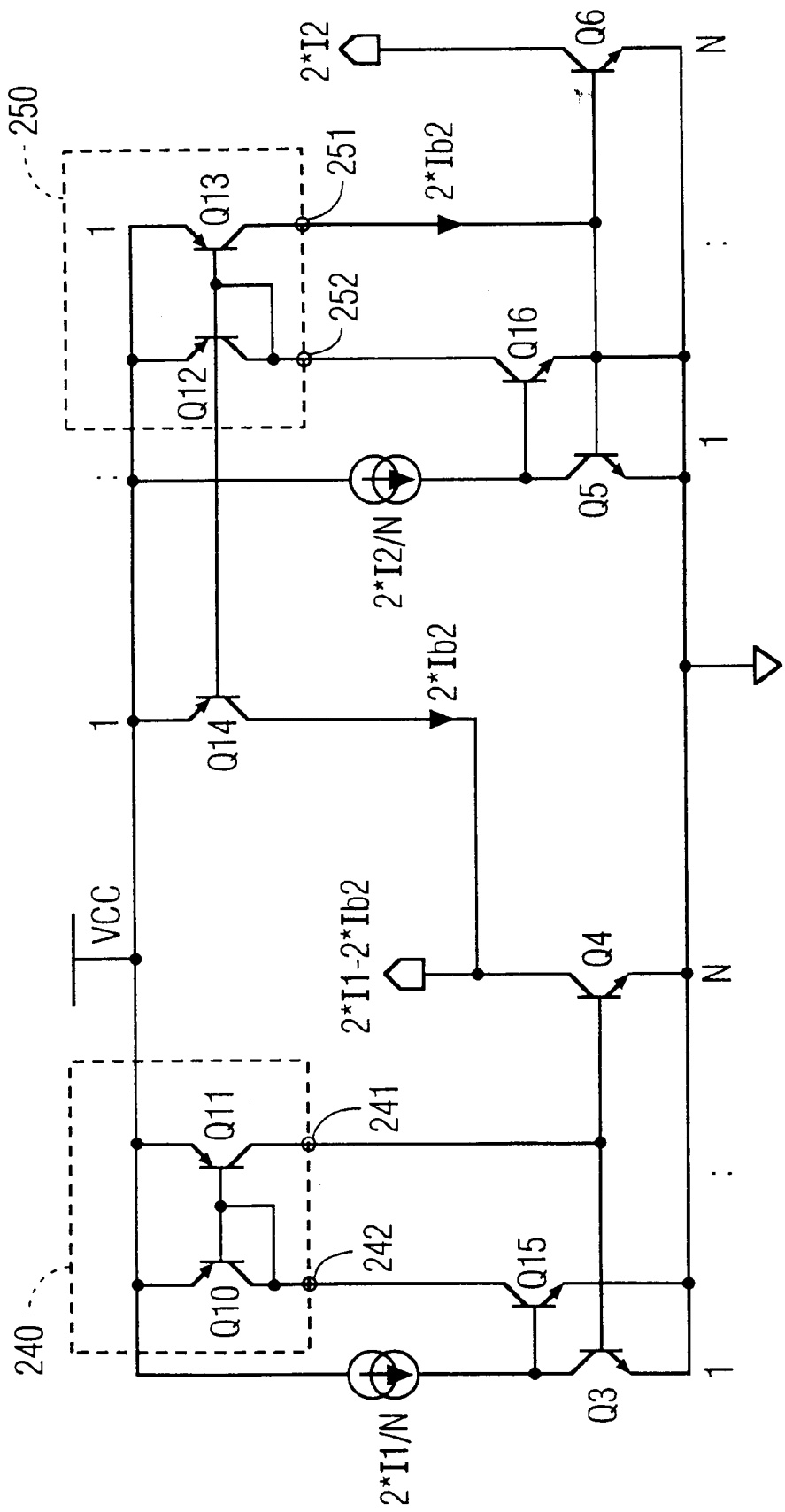
FIG. 4 illustrates another embodiment according to the invention of a biasing circuit for the multiplier cell of FIG. 3(a).

FIG. 4 shows another embodiment of a bias circuit to provide the bias currents to the multiplier 100. This circuit is better suited for low voltage operation than the circuit of FIG. 3. Circuit elements corresponding to those of FIG. 3(b) bear the same reference numerals. In this circuit, the beta helper transistors Q15 and Q16 have a common-emitter configuration. This modification lowers the required supply voltage by one base-emitter voltage Vbe, about 0.7 volts. Also, the base currents of the transistors Q3/Q4 and Q5/Q6 of the current mirrors 210, 220 are supplied, respectively, through the two PNP current mirrors formed by the transistor pair Q10/Q11 and by the transistor pair Q12/Q13. Coupling the transistor Q14 to the PNP mirror formed by the transistors Q12/Q13 makes available the current which is subtracted from the collector current of the transistor Q4 of the first current mirror. The resulting bias current for each of the input transistors Q1A and Q1B becomes $$I_{cI} \approx I_{eI} = I_1\left(1 - \frac{A_{i,d}}{\beta}\right), \quad (10)$$

which is identical to the result for the variable gain amplifier formed by the prior art circuits of FIGS. 3(a) and 3(b), which was given by Eq. 9. As was the case with the circuit of FIG. 3, this means that the beta immunity of the variable gain amplifier of FIG. 4 will be on par with that of the prior art circuit in FIG. 2, without the drawbacks of worsened power supply rejection or a higher minimum operating voltage.

Although preferred embodiments of the present invention have been shown and described, it will be appreciated by those skilled in the art that changes may be made in these embodiments without departing from the principles and spirit of the invention, the scope of which is defined in the claims. The process or technology by which the amplifier of the invention is made is not important and any of the standard bipolar or BiCMOS processes can be used. The transistors of the multiplier cell should be bipolar transistors as should the transistors of the second current mirror which reflect the base currents of the output transistors Q2A, Q2B. However, the remaining transistors used in the various current mirrors may be CMOS or BiCMOS devices. The latter devices tend to produce more accurate current mirrors, so that the beta helper transistors may also be dispensed with.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An amplifier for operation between a first supply and a second supply having a lower potential than the first supply, comprising:

a) a current multiplier circuit including a first, differentially coupled input pair of transistors each having a base for receiving an input current of the multiplier cell, a collector coupled to the first supply, an emitter and a common base-collector junction;

a second, differentially coupled output pair of transistors each having a base coupled to said base of a respective input transistor, a collector for output ting an output current of the multiplier circuit, and an emitter; and b) a bias circuit which biases the emitters of said input transistors with a first bias current and the emitters of said output transistors with a second bias current to control the ratio of the differential output current to the differential input current at a selected value, wherein the ratio of (i) the second bias current and (ii) the first bias current minus a current substantially equal to the base currents of the output transistors is substantially equal to the selected value of said ratio of the differential output currents to the differential input currents.

2. An amplifier according to claim 1, wherein said bias circuit generates a first current, subtracts from the first current a third current substantially equal to the base currents of said output pair of transistors, and biases said emitters of said input transistors with said first bias current being equal to said first current minus said third current.

3. An amplifier circuit according to claim 2, wherein said bias circuit includes a first current source, and a first current mirror having an input fed by said first current source and an output, coupled to said emitters of said input transistors of said multiplier circuit, which outputs said first current.

4. An amplifier according to claim 3, wherein said bias circuit includes a second current source, and a second current mirror having an input fed by said second current source and an output, coupled to said emitters of said output transistors of said multiplier circuit, which outputs said second current.

5. An amplifier according to claim 4, wherein said second current mirror comprises first and second current mirror transistors having a common base junction, and said bias circuit further comprises a third current mirror having an input coupled to said common base junction of said second current mirror and an output coupled to said output of said first current mirror, said third current mirror subtracting from said first current the third current equal to the base currents of said first and second current mirror transistors.

6. An amplifier according to claim 4, wherein said first current mirror includes third and fourth current mirror transistors, said third current mirror includes fifth and sixth current mirror transistors, and the transistors of the output pair of transistors and of each of the first, second and third current mirrors have substantially equal gain factors ($\beta$).

7. An amplifier according to claim 2, wherein said bias circuit includes a second current source, and a second current mirror having an input fed by said second current source and an output which output s said second current.

8. A variable gain amplifier for operation between a first supply and a second supply having a lower potential than the first supply, said variable gain amplifier comprising:
   a) a multiplier circuit comprising
      differential input terminals which receive a differential input current;
      differential output terminals which output a differential output current;
      a pair of bipolar input transistors each having a base coupled to a respective one of said differential input terminals, a collector coupled to a first supply, an emitter, and a common base-collector junction;
      a pair of bipolar output transistors each having a base commonly coupled, respectively, to said base of one of said input transistors and one of said differential input terminals, a collector coupled to a respective one of said differential output terminals, and an emitter coupled to said second supply; and
   b) a biasing circuit comprising
      first and second current sources;
      a first, input current mirror having an input coupled to the first current source, and an output coupled to said emitter of each of said input pair of transistors, said output outputting a first, said input current mirror having a first pair of current mirror transistors having bases coupled to each other,
      a second, output current mirror having an input coupled to the second current source and an output coupled to each emitter of said output pair of transistors to provide a second, bias current to each of said output pair of transistors, said output current mirror having a second pair of current mirror transistors having bases coupled to each other, and
      a third current mirror, said third current mirror having an input coupled to said bases of said second pair of current mirror transistors, and an output coupled to said output of said first current mirror, said third current mirrors subtracting from said output of said first current mirror a third current substantially equal to the base currents of said second pair of current mirror transistors, said first current less said third current equaling a first bias current applied to said emitters of said input pair of transistors.

9. A variable gain amplifier according to claim 8, wherein said biasing circuit further includes (i) a first beta helper transistor having a base coupled to the second current source, a collector coupled to the input of the third current mirror and an emitter coupled to the bases of each of said second pair of current mirror transistors and (ii) a second beta helper transistor having a base coupled to the first current source, a collector coupled to the first voltage supply and an emitter coupled to the bases of each of said first pair of current mirror transistors.

10. A variable gain amplifier according to claim 8, wherein said biasing circuit further comprises:
   (i) a fourth current mirror and a first beta helper transistor, said fourth current mirror having an input coupled to said bases of said first pair of current mirror transistors and an output, said first beta helper transistor having a base coupled to said first current source, a collector coupled to said output of said fourth current mirror and an emitter coupled to the second lower supply; and
   (ii) a fifth current mirror and a second beta helper transistor, said fifth current mirror having an input coupled to said bases of said second pair of current mirror transistors and an output, said second beta helper transistor having a base coupled to said second current source and an emitter coupled to said second power supply.

11. A method of biasing a multiplier cell having
   a pair of bipolar input transistors each having a base coupled to a respective one of said differential input terminals, a collector coupled to a first supply, an emitter, and a common base-collector; and
   a pair of bipolar output transistors each having a base commonly coupled, respectively, to one of said input transistors and one of said differential input terminals, a collector coupled to a respective one of said differential output terminals, and an emitter,
   said method comprising the steps of:
      controlling the gain of the multiplier cell equal to a ratio between the output currents and the input currents by biasing the emitters of said input transistors with a first bias current and the emitters of said output transistors with a second bias current, wherein the ratio of (ii) the second bias current and (ii) the first bias current minus a current substantially equal to the base currents of the output transistors is substantially equal to said ratio of the output currents to the input currents.

12. A method according to claim 11, wherein said controlling step comprises:
   generating a first current and a second current, the ratio of the second current to the first current corresponding to a desired current gain ratio between the output current and the input current of the multiplier cell;
   generating a third current by subtracting from the first current a current at least substantially equal to the sum of the base currents of the output transistors; and
   biasing said emitters of said input transistors with said third current and the emitters of said output transistors with said second current.

* * * * *